United States Patent [19]

Butt

[11] Patent Number: 4,524,238

[45] Date of Patent: Jun. 18, 1985

[54] SEMICONDUCTOR PACKAGES

[75] Inventor: Sheldon H. Butt, Godfrey, Ill.

[73] Assignee: Olin Corporation, New Haven, Conn.

[21] Appl. No.: 454,409

[22] Filed: Dec. 29, 1982

[51] Int. Cl.³ .......................... H05K 5/04; H05K 5/06
[52] U.S. Cl. ................................ 174/52 FP; 357/74; 357/81
[58] Field of Search .......... 174/52 FP, 16 HS, 50.61; 357/74, 81; 361/386, 389

[56] References Cited

U.S. PATENT DOCUMENTS

| 2,446,277 | 8/1948 | Gordon | 174/50.61 X |
| 2,967,984 | 1/1961 | Jamison | 174/16 HS |
| 2,999,194 | 9/1961 | Boswell et al. | |
| 3,113,252 | 12/1963 | Matea | |
| 3,190,952 | 6/1965 | Bitko | 174/52 FP |
| 3,320,351 | 5/1967 | Glickman | 174/52 FP |
| 3,341,369 | 9/1967 | Caule et al. | |
| 3,469,684 | 9/1969 | Keady | 174/52 FP |
| 3,475,227 | 10/1969 | Caule et al. | |
| 3,546,363 | 12/1970 | Pryor et al. | |
| 3,618,203 | 11/1971 | Pryor | |
| 3,676,292 | 7/1972 | Pryor et al. | |
| 3,698,964 | 10/1972 | Caule et al. | |
| 3,726,987 | 4/1973 | Pryor et al. | |
| 3,730,779 | 5/1973 | Caule et al. | |
| 3,740,920 | 6/1973 | Lane | |
| 3,810,754 | 5/1974 | Ford et al. | |
| 3,826,627 | 7/1974 | Pryor et al. | |
| 3,826,629 | 7/1974 | Pryor et al. | |
| 3,837,895 | 9/1974 | Pryor et al. | |
| 3,852,148 | 12/1974 | Pryor et al. | |
| 3,914,858 | 10/1975 | Sonoda et al. | |
| 3,988,825 | 11/1976 | Fuchs et al. | |
| 4,149,910 | 4/1979 | Popplewell | |
| 4,415,025 | 11/1983 | Horvath | 174/16 HS X |

OTHER PUBLICATIONS

Charles A. Harper, "Handbook of Electronic Packaging", pp. 9-27.
Hammer et al., "Thick Film Highbred Microcircuit Technology", pp. 295-298.

Primary Examiner—A. T. Grimley
Attorney, Agent, or Firm—Howard M. Cohn; Barry L. Kelmachter; Paul Weinstein

[57] ABSTRACT

Various embodiments of a casing adapted to receive an electronic device and in particular power discrete devices are disclosed. The casings include metal or metal alloy base components with the electronic device adhered to its surface. A metal or metal alloy leadframe is bonded to and electrically insulated from the base component. The electronic device is connected to the leadframe. A metal or metal alloy cover is bonded to the leadframe to seal the electronic device within the casing. Each of the modifications includes a technique for effectively removing the heat generated by the electronic device from the casing.

32 Claims, 8 Drawing Figures

SEMICONDUCTOR PACKAGES

The present invention relates to U.S. patent application Ser. Nos. 341,392 entitled "Semiconductor Casing" by S. H. Butt, filed Jan. 21, 1982, (now U.S. Pat. No. 4,461,924); 369,699 entitled "Improved Printed Circuit Board" by S. H. Butt, filed Apr. 19, 1982, (now U.S. Pat. No. 4,491,622); 369,785 entitled "Improved Chip Carrier" by S. H. Butt, filed Apr. 19, 1982, (now abandoned); 390,081 entitled "Improved Semiconductor Package" by S. H. Butt, filed June 21, 1982, (now abandoned); 390,095 entitled "Semiconductor Casing" by S. H. Butt, filed June 21, 1982, (now U.S. Pat. No. 4,410,927); 398,497 entitled "An Improved Semiconductor Casing" by S. H. Butt, filed July 15, 1982, (now U.S. Pat. No. 4,480,262); 405,640 entitled "Improved Hermetically Sealed Semiconductor Casing" by S. H. Butt, filed Aug. 5, 1982; 413,046 entitled "Multi-Layer Circuitry" by S. H. Butt, filed Aug. 30, 1982.

While the invention is subject to a wide range of applications, it is especially suited for use in packages for integrated circuits and discrete devices which consume either small amounts or substantial amounts of power and will be particularly described in that connection.

During the operation of a semiconductor device, the heat is generated on the face of the semiconductor chip or die. In conventional hermetic packages, the majority of the generated heat is first transferred through the thickness of the silicon chip, then through the brazing material or adhesive mounting the chip to a substrate and finally through the substrate. The substrate itself is often formed from low thermal conductivity ceramic which further impedes the heat dissipation. Moreover, the thermal conductivity of silicon is poor and the resistance to heat transfer represented by the thickness of the silicon chip is of considerable significance in the overall thermal performance of the package. In the case of chips which generate particularly large amounts of heat per unit area, heat transfer through the chip may become the limiting factor in the density of functions on the surface of the chip and/or may become the limiting factor in the power rating of discrete power devices. Even if the thermal conductivity of the silicon is not a limiting factor, the temperature drop required for heat transfer through the silicon is still of importance since this temperature difference has the effect of raising the "junction temperature" upon the surface of the chip. Generally, each 10° C. increase in junction temperature reduces the expected service life of the device by one-half.

The problem associated with the poor thermal conductivity of silicon is exacerbated because an increase in the diameter of the silicon wafer causes an increase in the minimum thickness of the wafer required for process handling. Actually, an increase in wafer diameter may be desirable since the cost of given size and complexity decreases as the diameter of the wafer increases. For certain applications where it is desired to minimize the problem of poor thermal conductivity, the wafers or individual dies are thinned upon completion of the wafer fabrication. Thinning a wafer is a costly and difficult procedure. The problems associated with thermal conductivity are becoming worse as the technological advances continue to decrease the cell size per function on the surface of the chip.

The present conventional plastic packing technology provides for heat removal directly from the face and back of the chip which are in contact with the encapsulating plastic. The back side of the chip contacts the mounting pad on the leadframe to which the chip is mounted. Since this pad is metal, thermal performance on the back side is approximately equal to that on the front side. The heat is conducted through the plastic to the leadframe or to the outer surface of the package. Since the plastic is a relatively poor thermal conductor, most of the heat is actually dissipated through the leadframe, especially when high conductivity alloys are used as leadframe materials. Although the heat is dissipated from both the face and reverse sides of the chip, its transfer through poorly conductive plastic is a serious disadvantage.

Generally, the power consumption of the electronic components encased in conventional dual-in-line packages and Quad packs is quite modest and the heat generated during their operation is comparatively small. However, as the number of functions incorporated on a single chip become greater and/or the functions upon the chip are spaced more closely together, the heat generated becomes a significant consideration. Also, the current trend towards incorporating relatively "high power" components into integrated circuits so as to reduce external components for "power functions" increases the generation of heat. Accordingly, the capability of dissipating the increase in generated heat becomes more important.

Besides the factor of removing the heat, it is also important to manufacture the casing in an economical fashion and form a strong reliable or hermetic seal as required. In the past, it has been known to use adhesives to bond semiconductor packages as taught in U.S. Pat. Nos. 3,740,920 and 3,914,858.

Techniques for hermetically sealing electrical components into metal housings are also known as taught in U.S. Pat. Nos. 2,999,194, 3,988,825 and 3,113,252.

Also, in U.S. patent application Ser. No. 341,392, filed Jan. 19, 1982 to Butt, there is disclosed, for example, "a highly reliable metal casing which is sealed and bonded using an adhesive." Further, in U.S. patent application Ser. No. 390,081, filed June 21, 1982 by Butt, there is disclosed a semiconductor package for mounting a chip formed of metal or alloy components having thin refractory oxide layers on their surfaces and a glass component to hermetically bond them together.

Glass or ceramic to metal composites or seals wherein the glass or ceramic is bonded to a base alloy having a thin film of refractory oxide on its surface is disclosed in U.S. Pat. Nos. 3,546,363, 3,618,203, 3,676,292, 3,726,987, 3,826,627, 3,826,629, 3,837,895, 3,852,148, and 4,149,910.

It is a problem underlying the present invention to provide a package for an electrical component which is able to provide heat transfer for chips which generate large amounts of heat per unit area and to reduce the temperature upon the surface of the chip.

It is an advantage of the present invention to provide a casing for an electronic component which obviates one or more of the limitations and disadvantages of the described prior arrangements.

It is a further advantage of the present invention to provide a casing for an electronic component which provides excellent heat transfer from the surface of the electronic component.

It is a yet further advantage of the present invention to provide a casing for an electronic component which has a strong reliable adhesive seal.

It is a still further advantage of the present invention to provide a casing for an electronic component which is hermetically sealed.

It is a yet further advantage of the present invention to provide a casing for an electronic component which is relatively inexpensive to manufacture.

Accordingly, there has been provided various embodiments of a casing adapted to receive an electronic device and in particular power discrete devices. The casings include metal or metal alloy base components with the electronic device adhered to its surface. A metal or metal alloy leadframe is bonded to and electrically insulated from the base component. The electronic device is connected to the leadframe. A metal or metal alloy cover is bonded to the leadframe to seal the electronic device within the casing. Each of the modifications includes a technique for effectively removing the heat generated by the electronic device from the casing.

The invention and further developments of the invention are now elucidated by means of the preferred embodiments shown in the drawings.

The present invention is particularly related to packages for discrete devices which consume substantial amounts of power. These power devices often generate large amounts of heat which may be detrimental to the life of the device itself. The invention described herein sets out a number of embodiments which provide different techniques for enhancing the elimination of the heat from the power device which is packaged in various casings of different configurations. Both electronic devices, electrical devices and semiconductor devices may be substituted for each other in the various embodiments of this invention.

Figure 1:
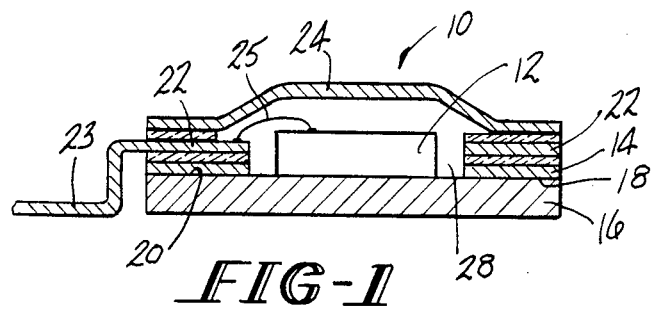
FIG. 1 is a cross section of a casing for an electronic component in accordance with the present invention.

Referring to FIG. 1, there is shown a casing 10 having a power device 12 sealed therein. A cladding layer 14 has a thin refractory oxide layer thereon. A metal or metal alloy substrate 16 has a first surface 18 bonded to a second surface 20 of the cladding 14. A metal or metal alloy leadframe 22 may be coated with a thin refractory oxide layer. A metal or metal alloy cover 24 may have a thin refractory oxide layer on at least the surface which is bonded to the top surface of the leadframe 22.

The preferred alloy for use in the embodiments of the present invention requiring a metal or metal alloy having a refractory oxide layer is a copper base alloy containing from 2-12% aluminum and the balance copper. A preferable alloy contains from 2-10% aluminum, 0.001-3% silicon, and if desired, a grain refining element selected from the group consisting of iron up to 4.5%, chromium up to 1%, zirconium up to 0.5%, cobalt up to 1% and mixtures of these grain refining elements and the balance copper. A CDA alloy C6381 containing 2.5-3.1% aluminum, 1.5-2.1% silicon, and the balance copper is a particularly useful material for this invention. Impurities may be present which do not prevent bonding in a desired environment.

The alloys useful with this invention and, especially alloy C6381 as described in U.S. Pat. Nos. 3,341,369 and 3,475,227 to Caule et al. which disclose copper base alloys and processes for preparing them, have a refractory oxide layer formed to one or more of its surfaces. The oxide layer may include complex oxides formed with elements such as alumina, silica, tin, iron chromia, zinc, and manganese. Most preferably, the refractory oxide layer is substantially aluminum oxide ($Al_2O_3$). The formation of the refractory oxide to the substrate may be accomplished in any desired manner. For example, a copper base alloy such as alloy C6381 may be preoxidized in gases having an extremely low oxygen content. The C6381 may be placed in a container with 4% hydrogen, 96% nitrogen and a trace of oxygen released from a trace of water mixed in the gas. This gas may be heated to a temperature of between about 330° C. and about 820° C. Depending on the temperature and amount of time the alloy is left in the heated gas, a refractory oxide layer of a desired thickness forms on the surface of the alloy.

The present invention is not restricted to applications of alloy C6381 but includes the broad field of metal or alloys which have the ability to form continuous or semi-continuous oxide layers on their surface. Preferably, the metal or alloy forms a thin refractory oxide layer suitable for bonding to solder glass and/or adhesive. Several examples of other metal alloys such as nickel base and iron base alloys are disclosed in U.S. Pat. Nos. 3,698,964, 3,730,779 and 3,810,754. Alloy C6381 is particularly suitable for this invention because it is a commercial alloy which forms such films when heated. The copper or copper base alloy component may also include composite metals in which the refractory oxide forming metal or alloy is clad upon another metal by any conventional technique. This other metal may be another copper alloy or any other metal or alloy whose bulk properties are desired for a specific application.

The present invention uses any suitable solder glass or ceramic component preferably having a coefficient of thermal expansion/contraction which closely matches the metal components. The glass is bonded to the thin refractory oxide layers to hermetically seal the casing 10. Besides adhering the metal components together, it electrically insulates them from each other. When the glass and the copper alloy preferably have the same or closely matched coefficients of thermal expansion, thermal stresses in the system may be essentially eliminated and the problems associated with thermal stress in the finished product alleviated. However, the specific character of the refractory oxide layer present on the preferred alloys C638 or C6381 allows bonding to solder glasses with significantly lower expansion/contraction coefficients than that of the alloy. It has been demonstrated that mechanically sound bonds can be achieved between C638 and CV432 (contraction coefficient of $127 \times 10^{-7}°$ C.).

Table I lists various exemplary solder glasses which are adapted for use in accordance with this invention.

TABLE I

| Solder Glass or Ceramic Type | Coefficient of Thermal Expansion, in./in./°C. |
| --- | --- |
| Ferro Corp.[1] No. RN-3066-H | $167 \times 10^{-7}$ |
| Ferro Corp.[1] No. RN-3066-S | $160 \times 10^{-7}$ |
| Owens Illinois[2] No. EJ3 | $160 \times 10^{-7}$ |
| Owens Illinois[2] No. CV432 | $127 \times 10^{-7}$ |

[1]Proprietary composition manufactured by Ferro Corporation, Cleveland, Ohio.
[2]Proprietary composition manufactured by Owens Illinois Corporation, Toledo, Ohio.

Since the casing 10 is particularly adapted for use with a power discrete semiconductor device, the number of the terminal leads 23 connected to leadframe 22 is small, typically three, and all may emerge from one sde of the package as shown. On the remaining sides of the casing, the space occupied by the leads is now occupied by spacers which may simply be leadframe 22.

The semiconductor device 12 is mounted onto the substrate 16 in any conventional manner such as by a thermally conductive adhesive. In addition, the lead wires 25 from the power device 12 to the leadframe 22 are attached by conventional techniques.

The inventive concept set forth in FIG. 1 is the removal of the cladding 14 and the placement of the power device directly onto the substrate 16. The substrate is preferably a material having a high thermal conductivity such as substantially pure copper.

Since the cladding 14 is bonded to the substrate 16, it is most convenient to bond the materials so that their entire surfaces 18 and 20 are in contact. Thus, the central area 28 used to accommodate the semiconductor chip or die 12 may require machining to remove the cladding layer 14 so as to expose the high conductivity layer 16. This permits mounting of the power device 12 directly upon the high conductivity layer and thereby maximizes the heat dissipation capability.

Figure 2:
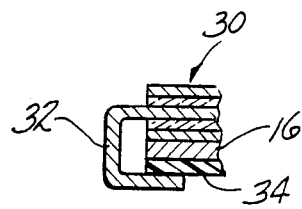
FIG. 2 is a cross section of a portion of a casing for an electronic component having a plastic dielectric on the bottom surface of the base member.

Referring to FIG. 2, there is illustrated a portion of a casing 30 which is very similar to the casing of FIG. 1 and has the same number where the components are identical. The terminal leads 32 have a configuration wherein they bend under the package. This is particularly advantageous for minimizing the surface area required to mount the device. For this configuration, an insulation layer 34 is added to the bottom surface of substrate 16 subsequent to the hermetic sealing of the casing 30. The insulating layer is preferably a plastic dielectric such as for example, a high temperature epoxy, a polysulfone or a polymide.

Figure 3:
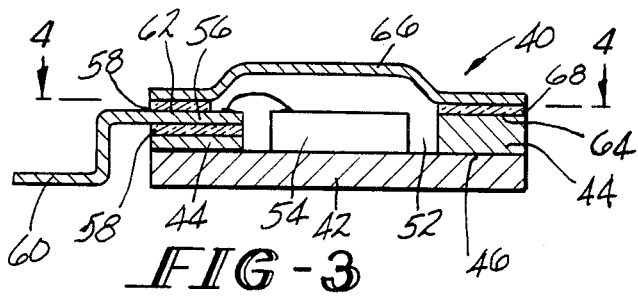
FIG. 3 is a cross section of a casing for an electrical component where the terminal leads preferably extend from a single slot.
Figure 4:
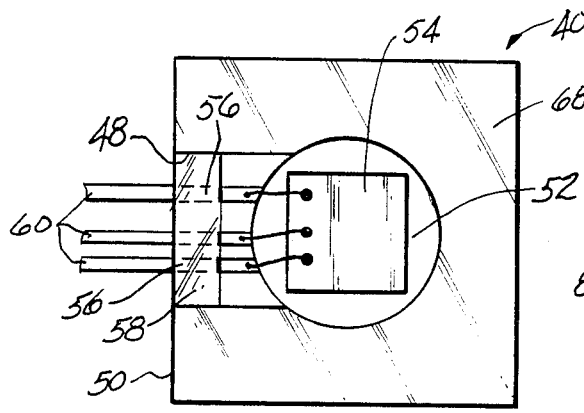
FIG. 4 is a view through 4—4 of FIG. 3.

An additional embodiment for use with the packages in which the leads emerge from only one side of the package is illustrated in FIGS. 3 and 4. This configuration is generally associated with discrete device packages but may also be used in some types of integrated circuit packages. The package 40 has a high thermal conductivity substrate 42 which may be formed of a copper or copper alloy. A cladding layer 44 of a glass bondable copper alloy is bonded to the upper surface 46 of the substrate. Layer 44 is provided with a slot 48 extending from an outer wall 50 of the package 40 to a central area 52. The discrete device 54 is bonded to the substrate 42 in area 52 in a conventional manner. A leadframe 56, formed of a glass bondable copper alloy, is bonded in the slot 48 by a glass 58. The leadframe 56 and terminal leads 60 are bonded into the slot 48 and insulated from contact with the cladding layer 44. The thickness of the cladding layer 44 in the slot is preferably selected so that the upper surface 62 of the leadframe is approximately flush with the upper surface 64 of the cladding layer in the non-slotted areas. A cover plate 66 may be formed of a glass bondable copper alloy and sealed to layer 44 and glass 58 with a layer of sealing glass 68. Note that the glass 58 which surrounds the leadframe 56 is primarily limited to the area of the slot.

The configuration shown in FIGS. 3 and 4 has special advantages suitable for high heat producing devices. In comparison to the similar embodiment of FIG. 1, less glass is required to seal the device within the package. Glass is the weakest part of the package and, therefore, failure of the package is frequently caused by a crack in the glass. Also, glass is generally more expensive than the metal and, therefore, the package can be produced more economically. Another significant advantage is that the glass has a much poorer thermal conductivity than metal. Therefore, by replacing some of the glass in the package with metal, heat radiation from the chip is more readily dissipated. The metal or metal alloy is preferably a copper metal or alloy having an oxide or refractory oxide surface, as described hereinabove. Although a sealing glass has been disclosed for forming a hermetically sealed package, it is also within the scope of the present invention to use an adhesive to bond the package together. Several examples of these adhesives are provided in the chart hereinbelow.

| Type | Name | Manufacturer |
| --- | --- | --- |
| a. 2 part room temperature structural epoxy | Bondmaster M688 | National Adhesives Co. |
| b. 1 part thermosetting encapsulating epoxy | Morton 410B | Morton Chemical Co. |
| c. thermoplastic | Philips Ryton | Philips Petroleum |
| d. encapsulating epoxy | Plaskon X7200 Plaskon X7200LS | Plaskon Electronic Materials |

Also, although the central area 52 is illustrated as being substantially circular, it is within the terms of the present invention to form the area with any desirable shape such as a square or rectangle.

Figure 5:
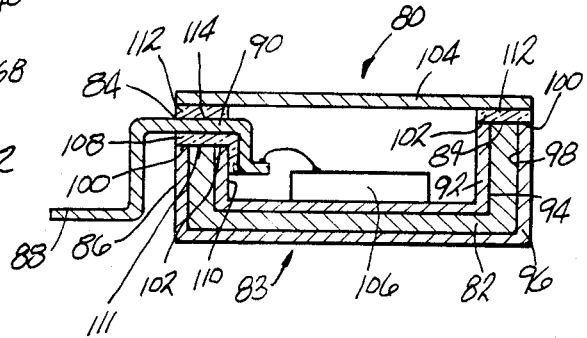
FIG. 5 is a cross section of a casing for an electronic component having a cup-shaped base.

Referring to FIG. 5, there is illustrated another embodiment of the present invention which is particularly adaptable for discrete devices which consume substantial amounts of power and generate a significant amount of heat. Package 80, as illustrated in FIG. 5, includes a substrate 82 which is drawn into the configuration of a cup 83 with a portion or slot 84 of the side wall 86 removed in order for the terminal leads 88 to extend outward from the package 80. The slot 84 extends down from the top or outer edge 89 of the cup 83 in a wall 86. The slot extends completely through the wall. A glass bondable cladding layer 92 is provided on the inner surface 94 of the substrate 82 and has substantially the same configuration as the substrate. Further, it is preferable to provide a cladding 96 similar to layer 92 on the outer surface 98 of the substrate 82. By providing cladding on both sides, the strength and resistance to fracture of the metal to glass bond, described hereinbelow, between the cladding layer and the sealing glass is maximized. However, it is within the scope of the present invention to provide only a single cladding on the substrate. The copper metal or alloy claddings 92 and 96 as described above preferably have a thin oxide, preferably refractory oxide, layer on their edges 100 and 102. A glass bondable copper or copper alloy cover 104, of a material similar to claddings 92 or 96, seals a discrete element 106 within cup 83. A sealing glass 108 bonds the cover 104 to the edges 100 and 102 at the notch 84. The sealing glass may also be bonded along a portion of the inner surface 110 of the clad 92. The sealing glass also may surround the leadframe 90 to bond the leadframe into the slot 84 and insulate it from the substrate 82 and claddings 92 and 96.

The lower edge 111 of slot 84, similarly shaped to slot 48 in FIG. 4, is preferably positioned so that the top surface 114 of the leadframe is substantially flush with the top surface 89 of the cup. This permits a continuous layer of sealing glass 112 between the cover 104 and surfaces 89 and 114 to seal the device 106 within package 80. The sealing glass 112 produces a strong bond with the refractory oxide layers on edges 100 and 102. However, if the substrate 82 does not have a refractory oxide layer on its surface, the glass may not form a strong bond to its surface. In the event that only a single cladding is used, the bond between the cover and the cup may not have the strength afforded by bonding to two claddings.

The cup may have any desired shape such as for example, round, square with rounded corners or rectangular with rounded corners. The specific configuration is designed for the specific application. Also, although a single slot is shown in FIG. 5, it is within the scope of the present invention to provide one or more slots on other walls of the package 80.

Although the device 106 is illustrated in FIG. 5 as being attached to the inner surface of the cladding 92, it is also within the terms of the present invention to remove the cladding so that the device 106 can directly bonded the substrate 82 and thereby improve the heat conduction from the package 80.

Figure 6:
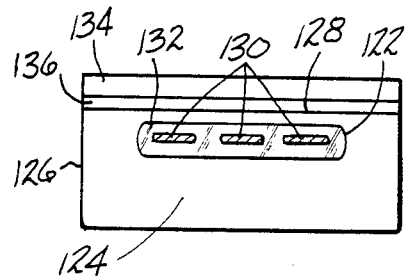
FIG. 6 is a cross section of a casing for an electronic component having a cup-shaped base where the terminal leads protrude from a hole on the casing wall.

Referring to FIG. 6, there is illustrated a modification of FIG. 5 where the slot is replaced by one or more holes or windows 122. The hole 122 may be punched or drilled into the side wall 124 of the cup 126. In this way, a continuous upper surface 128 is provided at the upper edge of the cup opening. The leadframe 130 is sealed into the hole 122 by a glass 132 similar to the bonding of leadframe 90 into the slot 84 of FIG. 5. If desired, the glass can also extend onto the inner surface of the cup to insulate the leadframe from the inner surface of the cup as shown in FIG. 5. Also, the cup may be formed in any desired configuration in accordance with the desired environment in which it will be operated. An advantage of this embodiment is the provision of a continuous edge 128 at the mouth of the cup. A cover 134 may be bonded to this edge by conventional techniques such as soldering or brazing. Also, the cover may be sealed with a sealing compound 136 such as a sealing glass or an adhesive as described above.

Referring again to FIG. 1, the device 12 is directly adhered to substrate 16 to improve the thermal heat dissipation from the hermetic package 10. The embodiment, as illustrated in FIGS. 3 and 4, has increased the ratio of side wall metal to glass and thereby increased the amount of heat transfer. The additional metal of FIG. 3 which replaces the glass in FIG. 1 improves the thermal dissipation characteristics of the package 40 as compared to package 10. The embodiment of FIG. 5 minimizes the overall size of the package since package 80 is preferably circular or rectangular with rounded corners. With a smaller package, the heat from the chip radiates a smaller distance before dissipating through the walls of the package. Finally, in the embodiment illustrated in FIG. 6, the heat dissipation is maximized since the cover may be bonded to the substrate with a conductive solder or brazing material which has a higher thermal conductivity than the sealing glass. Also, the final solder bonding temperature may be lower than temperatures normally associated with glass sealing and, therefore, the maximum temperature to which the discrete device is exposed after its installation in the package is held to a minimum. This is particularly advantageous in the case where the devices are heat sensitive.

The heat generated in the operation of a semiconductor device is primarily on the face of the semiconductor chip or die. In conventional hermetic packages, most of the heat is removed by heat transfer through the thickness of the silicon chip, then through the brazing material or adhesive which mounts the chip to the substrate and finally into and through the substrate. The thermal conductivity of silicon is poor and resistance to heat transfer due to the thickness of the silicon chip is of considerable significance in the overall thermal performance of the package. When chips generate particularly large amounts of heat per unit area, heat transfer through the chip may be the limiting factor in the density of functions on the surface of the chip or may become the limiting factor in the power rating of discrete power devices. Even if the thermal conductivity of the silicon is not an absolutely limiting factor, the temperature drop required for heat transfer through the silicon is still of importance since this temperature difference has the effect of raising the "junction temperature" upon the surface of the chip. In broad terms, each 10° C. increase in the junction temperature reduces the expected surface life of the device by one-half. The problem associated with the poor thermal conductivity of silicon is becoming exacerbated by the fact that, as the diameter of the silicon wafer increases, the minimum thickness of the wafer required for handling during wafer processing also increases. Increase in wafer diameter is desirable, however, since the cost per die of given size and complexity decreases as the diameter of the wafer increases. Sometimes, the wafers or individual dies are thinned mechanically after the fabrication is complete.

Figure 7:
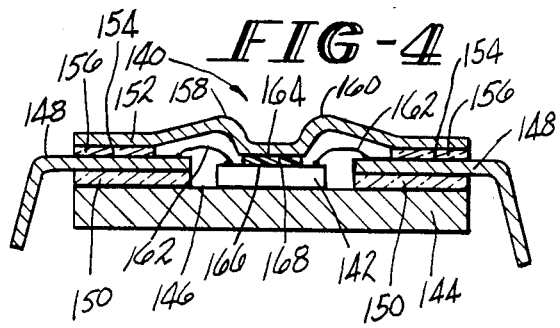
FIG. 7 is a cross section of a casing for an electronic component having a dielectric disposed between the face of the component and the cover.
Figure 8:
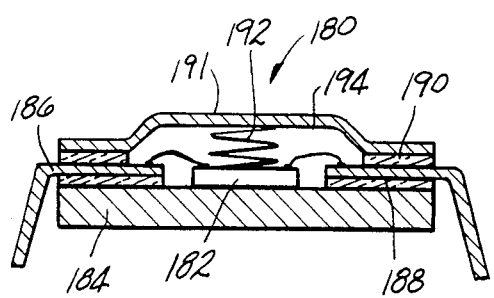
FIG. 8 is a cross section of a casing for an electronic component containing a thermally conductive spring between the face of the component and the cover.

Present state of the art plastic packages do provide for heat removal directly from the face of the chip since both the face and back of the chip are in contact with the encapsulating plastic. Actually, on the back side, contact is made through the mounting pad on the leadframe to which the chip is mounted. However, since this pad is metal, thermal performance on the back side is approximately equal to that of the front side. In the plastic package, heat is conducted through the package to the leadframe or directly through the package to the outer surface. The plastic is a relatively poor thermal conductor and most of the heat is dissipated through the leadframe when relatively high conductivity copper alloys are used. Although heat is dissipated from both the face and reverse sides of the chip, the requirement that it be transferred through poorly conductive plastic is a serious disadvantage. In fact, the high thermal performance metal substrate alternative to plastic packages described in U.S. patent application Ser. Nos. 398,497, 390,095 and 341,392, mentioned above, provides better overall thermal performance and lower junction temperatures than state of the art plastic encapsulation. Nevertheless, these disclosures do not provide means for direct heat removal from the face of the chip. The embodiments of the present invention, as set out in FIGS. 7 and 8, represent a significant advantage in package thermal performance. They provide a more efficient means of removing heat directly from the face of the chip.

Referring to FIG. 7, there is illustrated a package 140 which contains a chip 142. A high thermal conductivity substrate 144 has the chip bonded to an inner surface 146 by any conventional means. A leadframe 148 is bonded to the surface 146 by a bonding material 150. A cover 152 is bonded to the top surface 154 of the leadframe by a bonding material 156. The cover 152 has two outer protrusions 158 and 160 which are formed to provide clearance for the lead wires 162 connected by conventional means between chip 142 and the leadframe 148. An inner surface 164 of the cover 152 is formed so as to provide minimum clearance between the inner surface and the top face 166 of chip 142. It is necessary to provide some clearance between surface 164 and face 166 due to the manufacturing tolerances. If intimate contact between the surface 164 and the face of the chip were possible, where the manufacturing tolerances provided a negative clearance, an undue pressure would result on the face of the chip and possibly cause its failure. The minimal interstitial space between the face 164 of the cover and the face of the chip is preferably filled with a thermally conductive dielectric material 168 such as for example, a metal powder filled organic polymer. These may be thermally conductive adhesives such as epoxies or polymides mixed with copper or silver powder. By minimizing the clearance between the interface of the cover and the face of the chip and by using a thermally conductive dielectric, a relatively good heat transfer path from the surface of the chip to the inner surface of the metal is obtained. At the same time, heat dissipation through the chip and into the substrate 144 occurs. Thus, the total thermal heat dissipation occurs from the face of the chip, back of the chip, as well as any radiation of heat into the space enclosed by the cover and the substrate.

The package 140 may be either hermetically or non-hermetically sealed. If a non-hermetic seal is desired, the material 150 and 156 may be an epoxy as described hereinabove. In that event, the metal or metal alloy used to form the substrate, leadframe and cover may be of any material such as a copper or copper alloy which preferably has an oxide coating. Most preferably, it has been found that a thin refractory oxide coating of the type described above provides very strong bonds with epoxies and thereby prevents diffusion of contaminants at the bonding surface and increases the life expectancy of the package.

The package may also be hermetically bonded and the material 150 and 156 is preferably a glass sealing material of the type described hereinabove. Again, the metal or metal alloy used to form the substrate, leadframe and cover has an oxide coating to provide a strong glass to metal seal. Preferably, a copper metal or alloy having a refractory oxide layer thereon, as set out above, is chosen to bond to a solder glass. If desired, a high thermal conductive metal or alloy, such as copper, may be bonded to the substrate or leadframe to improve thermal performance.

FIG. 8 illustrates a package 180 which is similar to the package of FIG. 7 and is designed to provide very good heat dissipation from a chip 182. The substrate 184, the leadframe 186, and the bonding material 188 and 190 are substantially the same as in the embodiment of FIG. 7. However, in order to provide better thermal performance and to eliminate the concern with the small tolerance between the face of the chip and the cover, a thermally conductive spring 192 is used to establish thermal contact between the face of the chip and the inner surface 194 of cover 191. The surface of the spring which contacts the chip may be coated with a very thin layer of dielectric such as an epoxy or polymide to prevent the spring from shorting out the surface of the chip. This dielectric layer is very thin since the required breakdown voltage is generally less than 100 volts and the maximum operating voltage on the order of 10 volts. If the passivity treatment normally applied to protect the face of the chip is sufficiently reliable, this dielectric layer may not be required on the spring.

The prior art citations set forth in this application are intended to be incorporated by reference herein.

It is apparent that there has been provided in accordance with this invention a number of embodiments which are especially suited for use in packages of integrated circuits and discrete devices which consume either small amounts or substantial amounts of power and which satisfy the objects, means, and advantages set forth hereinabove. While the invention has been described in combination with the embodiments thereof, it is evident that many alternatives, modifications, and variations will be apprent to those skilled in the art in light of the foregoing description. Accordingly, it is intended to embrace all such alternatives, modifications, and variations as fall within the spirit and broad scope of the appended claims.

I claim:

1. A casing adapted to receive an electronic device, comprising:

a first high thermal conductivity metal or metal alloy substrate having a first surface, a first metal or metal alloy cladding having a first thin refractory oxide layer on at least a first surface thereof, said first surface of said substrate being bonded to a second surface of said first metal or metal alloy cladding, said first surface of said substrate adapted to have said electronic device adhered thereto to enhance the transfer of heat generated by said device to the outside of said casing;

a metal or metal alloy leadframe having a second thin refractory oxide layer thereon, said leadframe being bonded to said first refractory oxide layer and insulated from said first metal or metal alloy cladding by said first and second refractory oxide layers, said leadframe further being adapted for electrical connection to the electronic device;

a metal or metal alloy cover having a third thin refractory oxide layer on at least a portion of one surface thereof, said third oxide layer being bonded to said second refractory oxide layer whereby said electronic device is sealed between said substrate and said cover.

2. A casing as in claim 1 further including:

a glass component bonded between said first and second and said second and third thin refractory oxide layers for hermetically sealing said casing.

3. A casing as in claim 1 further including a slot in the wall of said cladding, said leadframe bonded to said cladding within said slot and adapted to be connected to said electronic device, said leadframe further being connected to terminal leads projecting between said cladding and said cover external to said casing.

4. A casing as in claim 3 further including a glass component bonded between said first and second and said second and third refractory oxide layers in the area of said slot and between said first and third refractory oxide layers in the remaining bonding areas for hermetically sealing said casing.

5. A casing as in claim 4 wherein said cladding, said leadframe and said cover comprise a copper or copper base alloy.

6. A casing as in claim 5 wherein said copper base alloy comprises 2–12% aluminum and the balance essentially copper.

7. A casing as in claim 6 wherein said copper base alloy consists essentially of 2.5–3.1% aluminum, 1.5–2.1% silicon, and the balance essentially copper.

8. A casing as in claim 7 wherein said thin refractory oxide layers include $Al_2O_3$.

9. A casing as in claim 3 further including a plastic dielectric bonded to a second surface of said substrate opposite said first surface of said substrate to electrically insulate said substrate from said terminal leads.

10. A casing as in claim 1 further including an adhesive component bonding said first and second thin refractory oxide layers and said second and third thin refractory oxide layers for sealing said casing.

11. A casing adapted to receive an electronic device, comprising:
a cup-shaped base component having a side wall with at least one slot extending down from the top edge of said cup-shaped component, said base component being adapted to receive said electronic device and further being comprised of:
a first metal or metal alloy cup-shaped cladding having a first oxide layer on the top edge, on the edge of said slot, and on the inner surface thereof;
a metal or metal alloy cup-shaped substrate having an inner surface bonded to an outer surface of said first metal or metal alloy cladding;
said casing further comprising:
a metal or metal alloy leadframe covered with a second oxide layer, said leadframe being disposed within said slot and adapted to be connected to said electronic device, said leadframe having terminal leads projecting external to said casing;
a first sealing component disposed within said slot for bonding said leadframe to said base component and for electrically insulating the leadframe from said base component;
a metal or metal alloy cover having a third oxide layer on at least one surface thereof; and
a second sealing component for bonding said cover to said first sealing component and to the top edge of said first cladding whereby said electronic device may be sealed between said base component and said cover.

12. A casing as in claim 11 wherein said base component further comprises a second metal or metal alloy cup-shaped cladding shaped like said first cladding, said second cladding having a fourth oxide layer at least on the top and slot edges thereof, said second cladding being bonded to an outer surface of said substrate, said first sealing component disposed in said slot bonding said leadframe to said second cladding and said second sealing component being disposed between said second cladding and said cover for bonding said cover to said second cladding.

13. A casing as in claim 12 wherein said first and second sealing components comprise a glass component for hermetically sealing said casing.

14. A casing as in claim 13 wherein said first, second, third and fourth oxide layers comprise thin refractory oxide layers.

15. A casing as in claim 14 wherein said metal or metal alloy cup-shaped claddings, leadframe and cover comprise a copper or copper base alloy.

16. A casing as in claim 15 wherein said copper base alloy comprises 2–12% aluminum and the balance essentially copper.

17. A casing as in claim 16 wherein said copper base alloy consists essentially of 2.5–3.1% aluminum, 1.5–2.1% silicon and the balance essentially copper.

18. A casing as in claim 17 wherein said thin refractory oxide layers include $Al_2O_3$.

19. A casing as in claim 12 wherein said first and second sealing components comprise an adhesive component for sealing said casing.

20. A casing as in claim 12 wherein said electronic component is bonded to the inner surface of said substrate to enhance the transfer of heat generated by said device to the outside of said casing.

21. A casing as in claim 12 wherein said metal or metal alloy comprises a copper or copper base alloy.

22. A casing as in claim 21 wherein said first and second sealing components comprise a glass component for hermetically sealing said casing.

23. A casing as in claim 21 wherein said first and second sealing components comprise an adhesive compound for sealing said casing.

24. A casing adapted to receive an electronic device, comprising:
a cup-shaped base component being adapted to receive said electronic device having at least one window in a side wall thereof, said base component including a first metal or metal alloy cup-shaped cladding having a first oxide layer on the top edge extending about the opening of said base component;
a metal or metal alloy cup-shaped substrate having an inner surface bonded to an outer surface of said first cladding;
said casing further comprising:
a metal or metal alloy leadframe covered with a second oxide layer, said leadframe disposed within said window and adapted to be connected to said electronic device, said leadframe having terminal leads projecting external to said casing;
a first sealing component disposed within said window for bonding said leadframe to said base component and for electrically insulating the leadframe from said base component; and
a metal or metal alloy cover being disposed on the top edge of said base component so that said electronic device may be sealed between said base component and said cover.

25. A casing as in claim 24 further including a second sealing component for bonding said cover to the top edge of said base component.

26. A casing as in claim 25 wherein said first and second sealing compounds comprise a glass component for hermetically sealing said casing.

27. A casing as in claim 26 wherein said first and second oxide layer comprises a thin refractory oxide layer.

28. A casing as in claim 27 wherein said thin refractory oxide layers include $Al_2O_3$.

29. A casing as in claim 24 wherein said first sealing compound comprises an adhesive component for sealing said window in the side wall.

30. A casing as in claim 24 wherein said metal or metal alloy comprises a copper or copper base alloy.

31. A casing as in claim 30 wherein said first and second sealing components comprise a glass component for hermetically sealing said casing.

32. A casing as in claim 30 wherein said first and second sealing components comprise an adhesive compound for sealing said casing.

* * * * *